United States Patent
Bieber

(10) Patent No.: US 11,437,905 B2
(45) Date of Patent: Sep. 6, 2022

(54) GATE DRIVER FOR RELIABLE SWITCHING

(71) Applicant: Solaredge Technologies Ltd., Herzeliya (IL)

(72) Inventor: Ofir Bieber, Ra'anana (IL)

(73) Assignee: Solaredge Technologies Ltd., Herzeliya (IL)

( * ) Notice: Subject to any disclaimer, the term of this patent is extended or adjusted under 35 U.S.C. 154(b) by 0 days.

(21) Appl. No.: 16/875,172

(22) Filed: May 15, 2020

(65) Prior Publication Data

US 2020/0366182 A1 Nov. 19, 2020

Related U.S. Application Data

(60) Provisional application No. 62/848,937, filed on May 16, 2019.

(51) Int. Cl.
*H02M 1/08* (2006.01)
*H03K 17/14* (2006.01)

(52) U.S. Cl.
CPC .............. *H02M 1/08* (2013.01); *H03K 17/14* (2013.01)

(58) Field of Classification Search
CPC ........ H02M 1/08; H03K 17/14; H03K 17/145
USPC .................................................. 327/108, 109
See application file for complete search history.

(56) References Cited

U.S. PATENT DOCUMENTS

| | | | | |
|---|---|---|---|---|
| 5,784,245 A * | 7/1998 | Moraghan | ............ | H01H 47/002 361/154 |
| 9,800,042 B2 * | 10/2017 | Engelhardt | ............ | G01R 31/50 |
| 10,469,057 B1 * | 11/2019 | Frank | .................... | H03K 17/04 |
| 10,680,601 B1 * | 6/2020 | Kempitiya | ............ | H03K 17/168 |
| 2005/0099751 A1 * | 5/2005 | Kumagai | ............ | H03K 17/0828 361/100 |
| 2005/0253165 A1 | 11/2005 | Pace et al. | | |
| 2009/0040796 A1 * | 2/2009 | Lalithambika | .... | H02M 3/33507 363/21.17 |
| 2009/0079355 A1 * | 3/2009 | Zhou | .................. | H05B 45/3725 315/246 |
| 2011/0085576 A1 * | 4/2011 | Crawford | ............... | H05B 45/38 372/38.07 |
| 2011/0210713 A1 * | 9/2011 | Kazama | ............. | H02M 3/1588 323/311 |
| 2012/0268026 A1 * | 10/2012 | Crawford | ........... | H05B 45/3725 315/210 |
| 2013/0278298 A1 * | 10/2013 | Curbelo | ............... | H03K 17/163 327/109 |
| 2014/0028357 A1 * | 1/2014 | Mehta | .................. | H03K 17/063 327/109 |
| 2015/0097613 A1 * | 4/2015 | Roewe | ................. | H03K 17/165 327/382 |

(Continued)

OTHER PUBLICATIONS

Oct. 12, 2020—EP EESR—EP 20175058.5.

*Primary Examiner* — William Hernandez
(74) *Attorney, Agent, or Firm* — Banner & Witcoff, Ltd.

(57) ABSTRACT

A driver for improving reliability of a switch in a power device, comprising one or more sensors configured to sense an operational parameter of a power device. The driver comprises a controller configured to receive one or more sensor values from the respective sensors. The controller is configured to adjust a driving pulse according to the sensor values. The controller is configured to apply the driving pulse to one or more control terminal of one or more switch of the power device.

20 Claims, 7 Drawing Sheets

(56) References Cited

U.S. PATENT DOCUMENTS

| | | | |
|---|---|---|---|
| 2016/0043713 A1* | 2/2016 | Okuda | H03K 17/567 |
| | | | 327/432 |
| 2016/0133410 A1* | 5/2016 | Bock | H01H 47/325 |
| | | | 361/160 |
| 2016/0142048 A1* | 5/2016 | Zoels | H03K 17/163 |
| | | | 327/109 |
| 2017/0138292 A1* | 5/2017 | Schweikert | F02D 41/20 |
| 2017/0373676 A1* | 12/2017 | Kaeriyama | H03K 17/0406 |
| 2018/0294671 A1* | 10/2018 | Li | H02J 50/12 |
| 2019/0267983 A1* | 8/2019 | Illing | H03K 17/0822 |
| 2019/0335559 A1* | 10/2019 | Shao | H05B 45/44 |
| 2019/0363709 A1* | 11/2019 | Bernacchia | H02M 7/5395 |
| 2020/0348706 A1* | 11/2020 | Cheng | G05F 1/575 |
| 2021/0028778 A1* | 1/2021 | Aeloiza | H03K 5/24 |

\* cited by examiner

GATE DRIVER FOR RELIABLE SWITCHING

The present application claims the benefit of U.S. Provisional Application Ser. No. 62/848,937, filed May 16, 2019, the disclosure of which is incorporated herein by reference for all purposes as if entirely set forth herein.

BACKGROUND

The present disclosure relates to the field of electronics. Power converters may have one or more switches, for example transistors and the like, that are used to alternatively connect or disconnect a power source of a switch-mode power supply (SMPS) to a power conversion circuit. For example, in a specific topology of an SNIPS, one or more switches may be switched to connect the power source to an electrical energy storage device, and when the switch is disconnected the stored power is converted to an alternative state, for example, a different voltage and/or current. In some cases, the switch may be connected directly to a load or different component not having storage capabilities. The switch may be a semiconductor device that has a gate, source and drain, and when a voltage/current is applied to the gate the electrical energy may flow from the source to the drain. Switching may be done using hard switching techniques which may use strong pulses to activate the gate, or soft-switching techniques which may be quasi-resonant, forced resonant, and/or the like.

SUMMARY

The following summary is a short summary of some of the inventive concepts for illustrative purposes only and is not an extensive overview, and is not intended to identify key or critical elements, or to limit or constrain the inventions and examples in the detailed description. One skilled in the art will recognize other novel combinations and features from the detailed description.

Disclosed herein are techniques and devices to reliably drive a gate of a switch. Various aspects measure one or more electrical parameters associated with the switch, for example temperature (e.g., of components, devices, circuits, environment, and/or the like), voltage, duty-cycle, current, and/or the like. The driving strength may depend on electrical parameters, for example gate voltage, gate waveform, gate current, and/or the like, such that the maximum rated voltage of the switch, for example a source-drain voltage, is not exceeded by transient voltage and/or current spikes, for example overshoots, undershoots, ringing, and/or the like. For example, a controller may take as input one or more of the electric parameters, and based on the input, determine (e.g., using a rule) a driving strength to be used for driving the gate. For example, a voltage is measured across the gate, and a controller (e.g., applying a rule) uses the voltage value as input to determine (based on the voltage value) to: use a full-strength gate driving pulse when the voltage value is below a first voltage threshold; use a minimal strength gate driving pulse when the voltage value is above a second voltage threshold; or to vary the gate driving pulse strength according to a certain equation (e.g., quadratic equation) between the two threshold values. The rules (e.g., mathematical equations) may be determined by prototype electrical measurements and/or correlated simulations (e.g., of the extended electronic circuit containing the switch) under different operating conditions, and determining an envelope of operating parameters where the maximum rated voltage is not exceeded. The envelope may be determined by fitting one or more equations, rules, look-up-tables, and/or the like, to the measured and simulated data.

BRIEF DESCRIPTION OF THE DRAWINGS

These and other features, aspects, and advantages of the present disclosure will become better understood with regard to the following description, claims, and drawings. The present disclosure is illustrated by way of example, and not limited by, the accompanying figures.

DETAILED DESCRIPTION

Figure 1A:
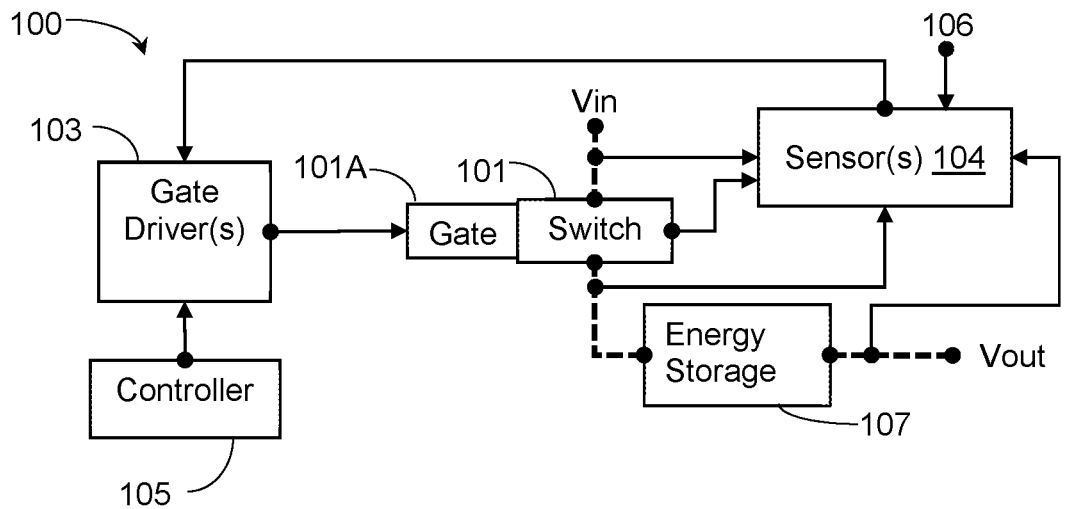
FIG. 1A shows, schematically, a circuit diagram of an example device having reliable gate drivers, according to illustrative aspects of the disclosure.

The accompanying drawings, which form a part hereof, show examples of the disclosure. It is to be understood that the examples shown in the drawings and/or discussed herein are non-exclusive and that there are other examples of how the disclosure may be practiced.

Disclosed herein are examples of aspects of devices, methods, and systems that may be used for driving the switches of a power device (for example, a switched mode power supply (SMPS), an inverter, or the like) by using sensor measurements and rules to determined gate drive strength. During the design and testing stage of the development process, simulations and electrical prototypes may be used to determine operational parameters of the power device under varying operational conditions, for example: input voltage, power conversion current/voltage, switching frequency, temperature, and/or the like. These parameters may be combined into a map of the operating conditions and parameters. Voltage and/or current spikes (referred to herein as spikes for the sake of brevity) may be mapped according to the operating conditions and parameters by measurements of a prototype circuit and/or simulations of the circuit. A limit of allowable voltage or current spikes may be determined, for example the rated absolute maximum voltage, denoted Vmax_abs_rating, of the switches, and reduced by a correction factor. Where the conditions result in voltage spike levels that exceed the voltage spike limit, the switch gate driving strength may be reduced to prevent the spikes. The drive strength may then be mapped to the operational conditions (e.g., as determined during operation by measurement sensor values), and may be converted to a set of rules that are responsive to the sensor values.

The term switch is used herein to mean any type of electrical device, such as a transistor or relay, that, based on a control signal applied to a control terminal of the switch, controls an electrical connection between a first contact terminal of the switch to a second contact terminal of the switch. For example, when a voltage or current is applied to the control terminal (e.g., the gate of a transistor), the effective resistance between the first contact terminal (e.g., drain of the transistor) and the second contact terminal (e.g., source of the transistor) changes from an open circuit to a short circuit (within the limits of the connecting technology of the switch). For the sake of brevity, the terms gate, source, and drain, are used herein to refer to the control terminal, first contact terminal, and second contact terminal, respectively, of any type of switch (e.g., field effect transistor (FET), bipolar transistor (BJT), solid-state relay, insulated-gate bipolar transistor (IGBT), etc.)

The gate of a semiconductor switch (e.g., the gate of a FET, a base of a BJT, a gate of an IGBT, and/or the like) may behave as a capacitor, and when the gate is charged allows current to flow between the source of the switch (e.g., source of the FET or collector of the BJT) and the drain of the switch (e.g., drain of the FET or emitter of the BJT). The speed at which the gate is charged may be dependent on the electrical circuit connected to the gate, including the gate driver operating characteristics, for example, current and voltage of the driver, the speed at which the gate current and voltage are made available, the type of switch and gate electrical properties, and other components connected to the gate circuit. For example, a fast and strong driver can send a relatively large amount of current to the gate quickly for minimum switching time and maximum efficiency, at the expense of increased cost, increased component count, decreased reliability, increased circuit noise, and the like. For example, a slow/weak gate driver may be less efficient but benefit from decreased noise and increased reliability.

The term gate driving strength may refer to the voltage and current levels of the pulse that is used to drive the gate to operate the switch, as well as temporal properties of the voltage a current for example ramp-up, ramp-down, waveform, and the like. These properties may be determined by adjusting the gate driver impedance, operation, driving circuit components, and/or the like. In many cases the voltage is a function of the source or drain voltage, and the current reflects the gate driving strength.

Voltage and/or current spikes may be caused by parasitic capacitances, LC circuits, RLC circuits, and/or the like. When energy stored in these circuits, which may be sections of the entire power device electronic circuit (schematic), is released the energy will follow the electrical conductors until dissipated to components as heat or converted to electrical energy stored in circuit components. While the voltage spike may have a direct negative impact on device reliability (e.g., reduction of reliability), the current spikes may be a bottle neck in some applications. For example, when the transient energy is released, the circuit may have a current limit on the energy dissipation path and thus cause a voltage spike. For example, current spikes may exceed the electro-migration stress, may convert the spike energy to electromagnetic interference radiating from the circuit, and/or the like. As used herein, the term spikes or the phrase voltage and/or current spikes will be used interchangeably, and mean the sudden increase in voltage and/or current due to transient energy release in a circuit, and it is understood that the spike may also be associated with a sharp increase in transient voltage, current, power, energy, or the like.

The rules may be integrated into the logic used to determine gate driver strength and the product is manufactured. During the operation of the power device, the gate driver may receive sensor values of the operating conditions, and may use the rules to determine the drive strength to use for the gates. Thereby, the gate driver may prevent the voltage and/or current spikes from exceeding the rated maximum voltage of the switches while providing for efficient converter operation under many operating conditions. These aspects allow increasing the reliability and improving the operation of the power device, for example, by increasing the mean time between failure (MTBF), reducing electromagnetic interference (EMI), and/or the like.

Reference is now made to FIG. 1A, which shows, schematically, a circuit diagram 100 of a device having reliable gate drivers 103, according to illustrative aspects of the disclosure. One or more switches 101 of a power converter (for example, a buck converter, a boost converter, a flyback converter, and/or the like) may be alternately closed and opened to allow current to flow from input terminals, denoted Vin. The current may flow through one or more energy storage components 107, for example inductors, capacitors, transformers, and/or the like, to supply power to output terminals, denoted Vout (e.g., Vout may be connected to a load—not shown). The thick dashed lines of circuit 100 designate the electrical operation conductors and the thin solid lines designate the electrical control conductors. As used herein, the term "conductor" means an electrical conductor. Switch 101 comprises a gate 101A, for example, a transistor gate, that enables opening and closing switch 101. To limit voltage spikes (or alternatively current spikes, for example, voltage or current spikes applied to the switch across the source and drain terminals caused by parasitic capacitances, LC circuits, RLC circuits, and/or the like), denoted Vspike, from exceeding the maximum allowable voltage of switches 101, one or more sensors 104 may be included in the circuit to measure various parameters, for example, input voltage Vin, switch 101 temperature, energy storage 107 voltage, switch 101 source voltage, switch 101 drain voltage, ambient temperature 106, power device temperature, and/or the like. The sensor(s) 104 measurement values may be retrieved by a gate driver 103 that computes, based on the sensor 104 values and/or rules (for example, retrieved by gate driver 103 circuit, hardwired into gate driver 103 circuit, provided by controller 105, and/or the like), and may be used to determine a drive strength to be used for operating switch 101. During operation of the power converter, controller 105 operates gate driver 103 to open or close each gate 101, and gate driver 103 determines the strength of the gate driver (for example, determined by sensor(s) 104 and according to rules) and operates (e.g., raises or lowers a voltage) the switch gate 101A.

Figure 1B:
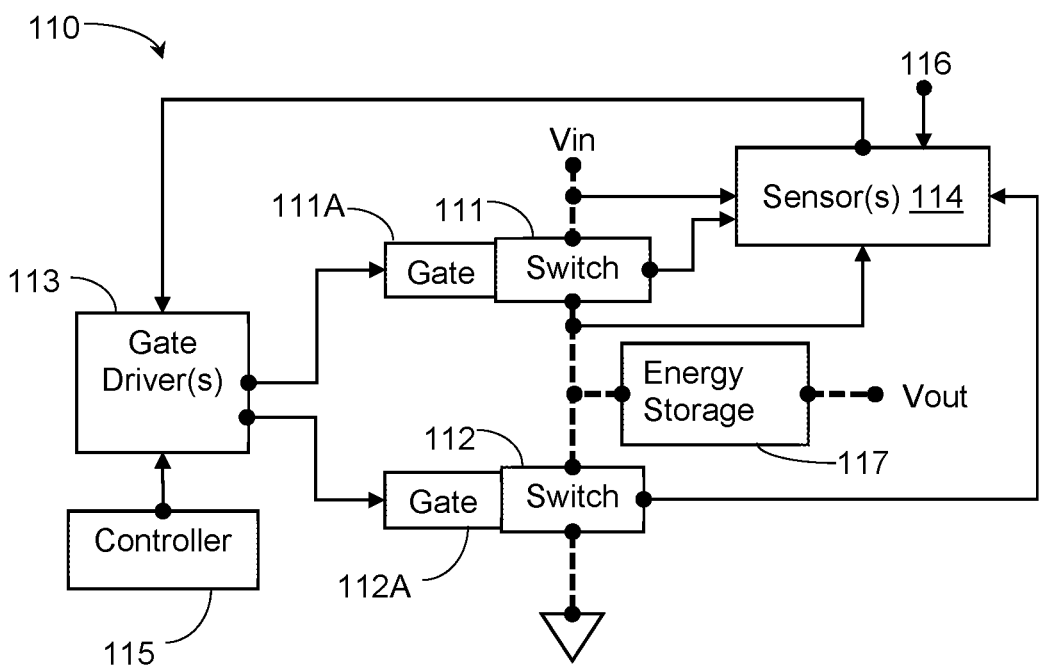
FIG. 1B shows, schematically, a circuit diagram of an example power device having reliable gate drivers, according to illustrative aspects of the disclosure.

Reference is now made to FIG. 1B, which shows, schematically, a circuit diagram 110 of a power device having reliable gate drivers, according to illustrative aspects of the disclosure. Switches 111 and 112 of a power device, for example, a half-bridge converter, a buck-boost converter, a Cuk converter, and/or the like, may be alternately closed and opened to allow current to flow from input terminals, denoted Vin. The current may flow through one or more energy storage components 117, for example, inductors, capacitors, transformers, and/or the like, to supply a converted voltage/current to output terminals, denoted Vout (e.g., Vout may be connected to a load—not shown). Each switch 111 and 112 comprises a respective gate 111A and 112A, for example, a transistor gate or the like, that enables opening and closing switch 111 and 112, respectively. To limit the voltage spikes, denoted Vspike, for example, voltage spikes form parasitic capacitances and/or the like, from exceeding the maximum allowable voltage of switches, one or more sensors 114 may be included in the circuit to measure input voltage Vin, switch 111 and/or 112 temperatures, energy storage voltage, switch 111 and 112 source voltage, switch 111 and 112 drain voltage, ambient temperature, power device temperature, and/or the like. The sensor(s) 114 measurement values may be retrieved by a gate driver 113 that computes a gate drive strength to be used for driving switch 101, based on the sensor 114 values and/or rules (for example, retrieved by gate driver circuit 113, hardwired into gate driver circuit 113, provided by controller 115, and/or the like). During operation of the power converter, controller 115 operates gate driver 113 (for example, sends signals to open or close gates 111 and 112), and gate driver 113 determines the strength of the gate driver (for example, determined by sensor(s) 114 values and according to rules) to gates 111A and/or 112A. The gate driving pulse strength (e.g., gate driver current when activating switch) may be different between gates 111A and 112A, depending on the rules and/or input sensor values for each driving strength.

Figure 1C:
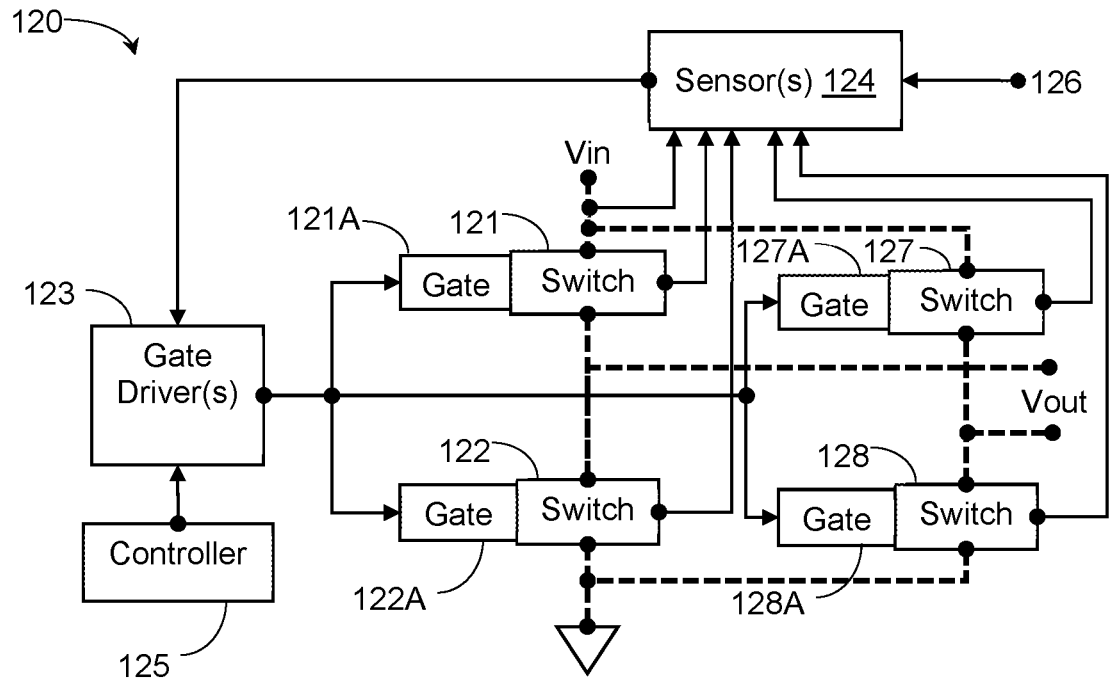
FIG. 1C shows, schematically, a circuit diagram of an example power device having reliable gate drivers, according to illustrative aspects of the disclosure.

Reference is now made to FIG. 1C, which shows, schematically, a circuit diagram 120 of a power device having gate drivers, according to illustrative aspects of the disclosure. Switches 121, 122, 127, and 128 of a power device, for example, found in a full bridge converter or the like, may be alternately closed and opened to allow current to flow from input terminals, denoted Vin. The current may flow optionally through one or more energy storage components (not shown), for example, inductors, capacitors, transformers, and/or the like, to supply a converted voltage/current to output terminals, denoted Vout (e.g., Vout may be connected to a load—not shown). Each switch 121, 122, 127, and 128 comprises a respective gate 121A, 122A, 127A, and 128A, for example, a transistor gate or the like, that enables opening and closing switch 121, 122, 127, and 128, respectively. To limit the voltage spikes, denoted Vspike, for example, voltage spikes from parasitic capacitances and/or the like, do not exceed the maximum allowable voltage of switches, one or more sensors 124 may be included in the circuit to measure input voltage Vin, switch 101 temperature, energy storage 107 voltage, switch 101 source voltage, switch 101 drain voltage, ambient temperature 106, power device temperature, and/or the like. The sensor(s) 124 measurement values may be retrieved by a gate driver 123 that computes a drive strength to be used for driving switch 101 based on the sensor 124 values and/or rules (for example, retrieved by gate driver circuit 123, hardwired into gate driver circuit 123, provided by controller 125, and/or the like). During operation of the power converter, controller 125 operates gate driver 123, and gate driver 123 sends the gate pulses (whose strength/current may be determined by sensor(s) 124 and according to rules), to gates 121A, 122A, 127A, and/or 128A.

Figure 2:
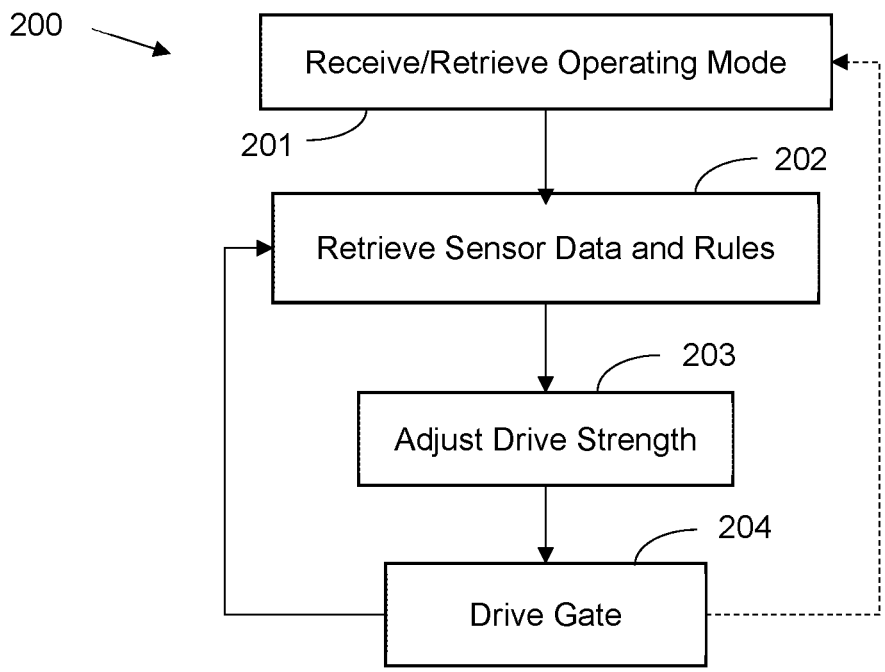
FIG. 2 shows a flowchart for reliably driving the gates of switches in power devices, according to illustrative aspects of the disclosure.

Reference is now made to FIG. 2, which shows a flowchart of a method 200 for reliably driving the gates of switches, for example, switches 101, 111, 112, 121, 122, 127, and 128, of FIGS. 1A-1C, in power converters, according to illustrative aspects of the disclosure. Method 200 may be carried out at least in part by gate driver 103, 113, 123, 440, 441, 502, 533, 535, 538, and/or the associated circuits. For example, a controller (e.g., 105, 115, 125, 420, 421, 502, or the like) or logical circuitry associated therewith. A gate driver (e.g., 103, 113, 123, 440, 502, 533, 535, 538, etc.) may receive (e.g., retrieve from memory or the like), at step 201, information (e.g., a command, an operating mode), for example, from a controller (e.g., 105, 115, 125, 420, 421, 502, or the like), and may, at step 202, retrieve sensor data (e.g., directly or indirectly from 104, 114, 124, 501, or the like) and/or rules (e.g., from the controller or memory device). At step 203, the gate driver may determine gate driving strength (for example, the gate driving pulse current, voltage, power, energy, and/or the like) based on sensor data and/or rules, and at step 204 may drive the switch gates according to the determined drive strength.

Figure 3:
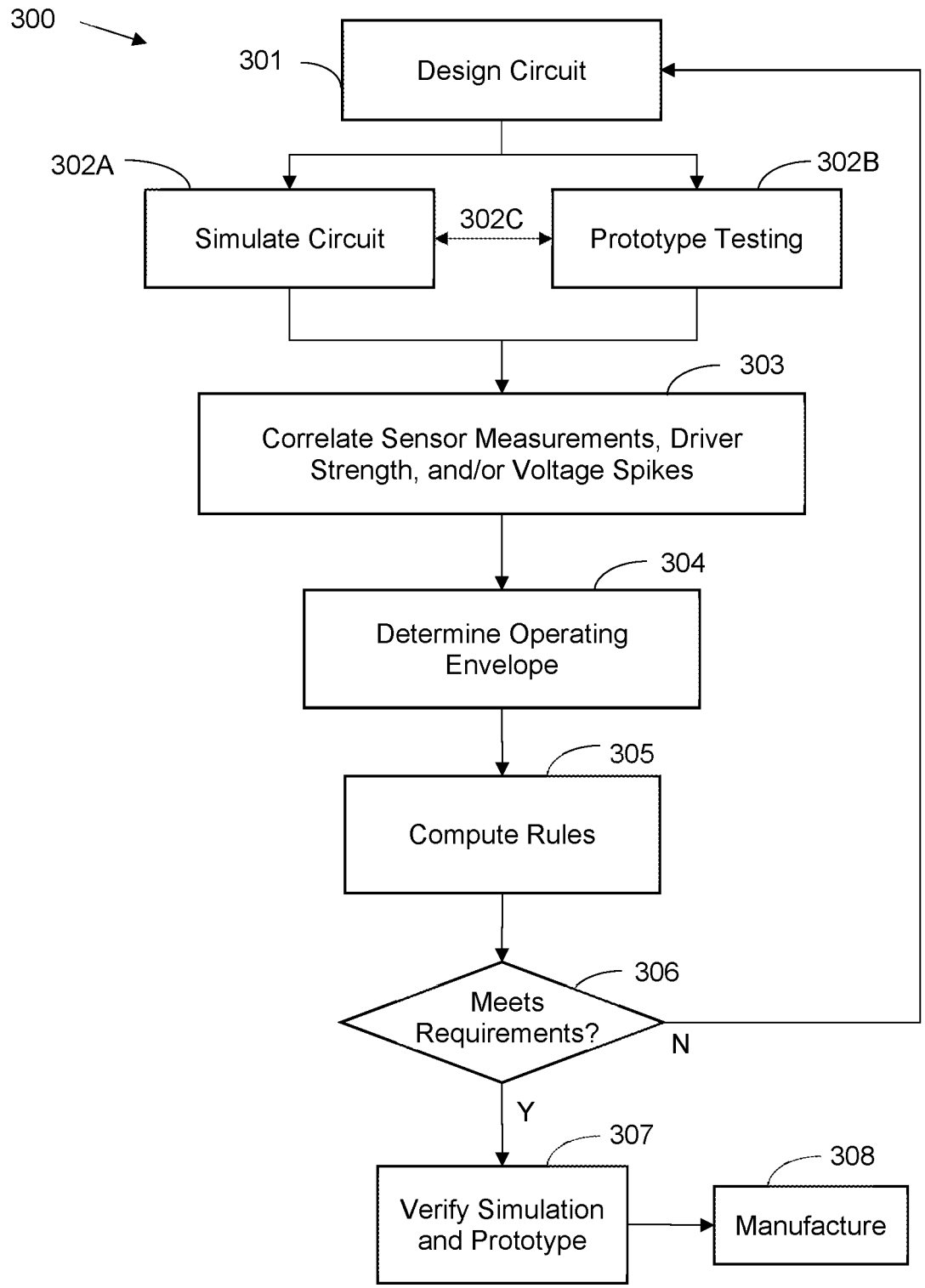
FIG. 3 shows a flowchart for determining reliable gate driving rules and equations, according to illustrative aspects of the disclosure.

Reference is now made to FIG. 3, which shows a flowchart of a method 300 for determining reliable gate driving rules/equations/look-up-tables (LUTs), according to aspects of the disclosure. The steps of this method may be executed in different orders than the example of FIG. 3, and steps may be omitted as needed for other examples. A circuit for a power converter is designed 301 (e.g., including selecting components). The circuit may be simulated at step 302A and/or a prototype circuit may be built and tested at step 302B, where the prototype may be a working prototype, for example, having substantially identical electrical properties to a final product in terms of printed circuit board layout and components. During the simulations at step 302A and testing at step 302B, the results may be compared and/or analyzed at step 302C to confirm that the design and prototype are aligned. The data from the simulations at step 302A, testing at step 302B, and/or comparing/analyzing at step 302C may be correlated at step 303 so that the relationships between the sensor measurements, driver strength, and/or voltage spikes may be determined. The correlations may be utilized to determine an operating envelope at step 304, for example, the limits of the driver strength at different operating conditions (for example, operating voltage levels, current levels, temperatures, and/or other sensor data) that may be based on component operational, safety, and reliability limits of the switch. The operating envelope, for example, may include a selection of operating conditions that reliably operate the switch without exceeding a specified voltage (for example, related to the absolute maximum voltage across the switch), and may be used in step 305 to compute rules (e.g., in the form of parameters stored in a look-up-table (LUT) or determined by an equation(s), and/or the like) that accept operating conditions (e.g., as indicated by sensor measurements), and based on the operating conditions, select the driver strength. For example, reliably operating a switch may include not exceeding the threshold voltage related to Vmax_abs_rating (for example, the rated absolute maximum voltage) of the switch, and thereby increasing the average mean time between failure of the switches. At step 306 the simulations of step 302A, the prototypes of step 302B, and/or the computed driver strengths of step 305 are checked to confirm that these aspects meet the design requirements, for example, determined by further simulations. For example, the rules (e.g., LUTs, and/or equations) are implemented in further simulations and/or prototypes to verify at step 307 the design, and the design is manufactured 308. When the requirements are not met at step 306, the process is restated from the circuit design at step 301 (e.g., to modify the design or select different components). Steps disclosed herein may be executed in other orders or eliminated.

Figure 4:
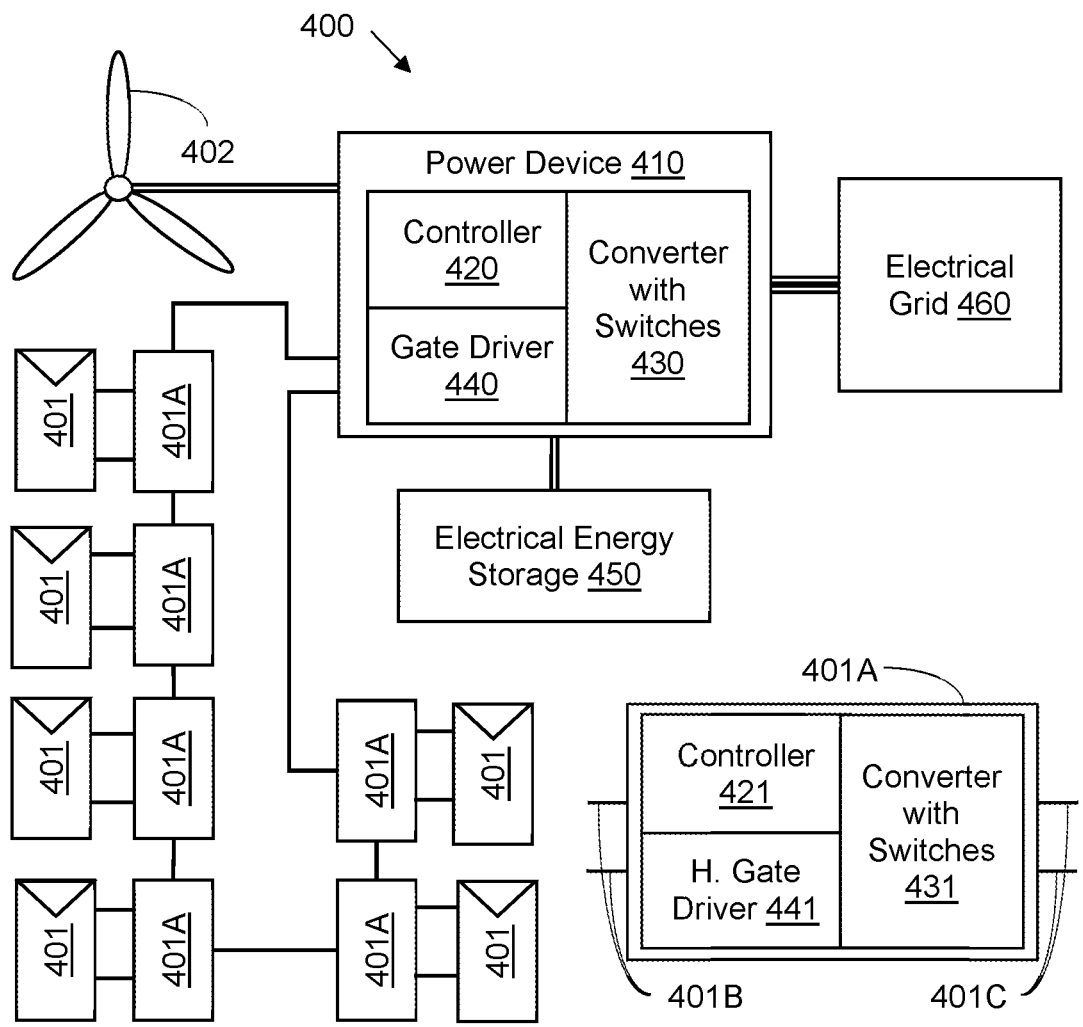
FIG. 4 shows, schematically, a system for power generation comprising reliable gate drivers for power devices, according to illustrative aspects of the disclosure.

As an example application of the aspects disclosed herein, a renewable power generation system is illustrated in FIG. 4. FIG. 4 shows, schematically, a system 400 for power generation comprising gate drivers 440 for power converter device 410, according to illustrative aspects of the disclosure. A power conversion device 410 (for example, an inverter) may comprise gate driver 440, controller 420, and converter with switches 430. Power conversion device 410 may, for example, convert power, for example, DC power from one or more solar panels 401 optionally using power optimizers 401A, or AC power from wind turbines 402, and/or the like, to DC power (for example, an inverter comprising a DC-DC power converter for this purpose) for charging an electrical storage device 450 (for example, a battery, a compressed air electrical storage, a thermal electrical storage, and/or the like) or to AC power for powering a load or for feed in to an electrical grid 460. Optimizers 401A may comprise input and output terminals 401B and 401C, controller 421, gate drivers 441, and DC/DC converters with one or more switches 431.

In general, gate drivers are characterized by their gate driving strength, for example, the current rating of the driver. Power converters, for example, switched-mode power supply topologies, or different electronic devices including switches, may benefit from the use of the disclosed gate drivers, but more so in hard switching gate driver applications (when compared to soft switching topologies, e.g., resonant switching and/or the like). In switch-mode power supplies (SMPS), the gate driver turns the gate on and off, for example, by injecting higher drive currents to the switch's gate. Disadvantages of the SMPS gate driving may include larger voltage spikes (for example, overshoot and undershoot), EMI, and/or the like.

Voltage spikes may cause reliability issues, for example, when the operational voltage input (e.g., Vin) is substantially a maximum input voltage rating of a switch and/or device. For example, the switch may be connected directly to the input voltage of the device. For example, when Vin is close to Vmax_abs_rating or the voltage difference between source and drain is close to Vmax_abs_rating. Usually, a voltage margin may be designed into the device/circuit, for example, a difference between an anticipated maximum input voltage (e.g., voltage difference between source and drain) and the maximum rated voltage of the switch, for example, a switch voltage headroom (e.g., margin between maximum voltage rating and the largest voltage difference between source and drain that the switch will experience in operation) or the like. The margin reduces the probability that a voltage spike may raise the voltage applied to the switch above the baseline input voltage, and thereby exceed the rated maximum voltage of the switch (e.g., the absolute maximum rated drain to source voltage). The spike voltage adds to the baseline direct current (DC) input voltage, (Vtotal=Vin+Vspike), and when the total voltage between the source and drain exceeds the switch's maximum absolute voltage rating, damage may be caused to the switch, reducing the lifetime of the switch.

The maximum absolute voltage rating is a very "expensive" parameter, and thus a gate driver that can use a switch with as lower Vmax_abs_rating is beneficial. By way of example, when designing a power converter, an increase in maximum voltage rating may result in a large increase in the cost of the component, for example, by a cost function of cost=f(Vmax_abs_rating)^2.2), where Vmax_abs_rating may be associated with the parameter absolute maximum rated Vds recorded on the switch datasheet. For example, a Rohm Semiconductor RD3H200SNFRATL rated at 45 volts (V) Vds may cost $1.77 per unit, and RSJ400N10FRATL rated at 100 V Vds may cost $3.18, and/or the like.

Furthermore, a first-order term related to EMI levels may be associated with the input voltage level to the power converter, and thus also is strongly dependent on Vmax=Vin+Vspike. For example, a strong gate pulse (e.g., with higher current gate pulse and associated higher gate capacitance) may contribute to abrupt changes to the voltages and/or currents across the switches (e.g., voltage difference between the source and drain of a transistor), and produce EMI at the switching frequency and at harmonics of the switching frequency.

The disclosed gate driver may measure the voltage at the source and drain terminals of the switch (or a differential voltage between the source and drain terminals) for determining the switching strength to use, so that the voltage spikes do not exceed a predetermined threshold. The voltage spikes may be the maximum instantaneous voltages measured across two terminals of a switch (e.g., the source and drain terminal, the source and gate terminals), or between a switch terminal and a reference terminal (e.g., the source terminal and ground, the source terminal and the low voltage device input terminal) and/or the like.

The rules (e.g., LUTs and/or mathematical equations) control the gate driving strength according to the switch terminal voltages. For example, the gate driver may follow a rule that determines that above a direct current (DC) measured voltage threshold (Vin), the driving strength of the switch may be reduced. For example, the drive strength may be reduced as a linear function of the measured voltage across the switch terminals (e.g., maximum absolute rated Vds of a MOSFET) between two voltage limits. In other examples, a polynomial function, a lookup table, multiple voltage threshold levels, a power function, and/or the like, may be used to reduce the gate drive current according to the measurements from sensors, for example, voltage, current, or temperature values, of the operating conditions of power converter. In this manner, the voltage spike behavior may be modified and limited to be within the device reliability margin, for example, below the maximum absolute voltage rating. The margin may be dependent on the working voltages across the switch terminals.

For example, a buck converter may use switches rated at 15 V and be designed for a maximum converter input supply of 12 V. Simulations may show that when a 3 ampere (A) driving strength for the gate is used, a 10 V spike overshoot across the switch terminals occurs, and when a 1 ampere (A) driving strength is used, a 3 V spike overshoot occurs (for example, a non-linear dependence). The gate driver strength algorithm may include the rule that for up to Vin=5 V, the driver may use a 3 A current driving strength, from Vin=5 V to the maximum Vin=12 V the driving strength may decrease linearly from 3 A to 1 A, and above Vin=12 V, switching at a drive strength of 1 A and/or changing to soft-switching technique (for example, a resonant switch technique, a quasi-resonant switching technique, and/or the like which may reduce voltage spikes, EMI, and/or the like). The rule for this example may reduce the driving strength to avoid violating the maximum absolute voltage rating of the switch. When the 1 A driving strength is used for all input voltages (for example, when using the weakest driving strength of this example), higher switching losses may be observed for most voltages in the operational voltage range, and at a 12 V input a 1 A driving strength may result in the same losses us when using the rule. The rules may be designed such that the highest drive strength at given sensor value(s) is used that does not exceed the maximum absolute voltage rating of the switch thereby minimizing switching losses to the greatest possible extent.

One or more current measurements (e.g. through one or more terminals of components(s), at one or more time points, and/or the like) may also be used to determine a preferred gate driving strength. For example, the voltage spike may also be dependent on the current through the switch. For example, higher current values result in a higher spike at a fixed driving strength. The power converter may operate at various operating conditions (for example, current, voltages, duty-cycle, and/or the like), and when the conditions are such that a voltage spike may exceed the margin available (for example, the difference between the input voltage and the maximum absolute voltage rating), the gate driving strength may be for example, lowered for lowering the voltage spike at high current levels while maintaining performance to the greatest possible extent.

In many power converters, the maximum current through a switch occurs during transients (for example, changing between two electrical operating points) and the voltage may be significantly lowered, and thus restricting the switching strength during the transients may be beneficial during the worst-case scenarios of voltage and current combinations. Measurements of the current flowing through the switch may thus be used together with the voltage measurements to predict the voltage spikes at the switch terminals, and thus be used to lower the switching strength using rules and/or functions to prevent a transient voltage spike from degrading the switch reliability.

A rule for converting current to gate driving strength may be similar to the rule described with respect to voltage. For example, starting from a certain current threshold the gate driver strength is reduced to avoid violating the maximum absolute voltage rating. Another rule example for converting current and voltage to driving strength may be defined as when both voltage and current values are above respective thresholds, the gate driving strength (e.g., current) is reduced to avoid exceeding the maximum absolute voltage rating of the switch. An example rule may be when the product of multiplying the voltage value by the current value (i.e. power) is above a threshold.

Following is an example of a method for determining a gate driver rule for operating a buck converter:

1. Measure Vin (for example, as at step 202 of FIG. 2).
2. Calculate the required driving strength using the equation: Driving strength=Vin*a+b, where a and b are parameters described below (for example, as at step 203 of FIG. 2).
3. Set the driver driving strength configuration, for example, by switching driver output stage (for example, the drivers in the circuit closest to the gate) and the pre-driver conductors on and off according to the Vin-dependent equation results (for example, as at step 203 of FIG. 2).

When designing a power converter (e.g. a half bridge inverter), the following method may be used applying gate driver rules:

1. Specify maximum input voltage, denoted $Vin_{max}$, for the design (for example, as at step 301 of FIG. 3).
2. According to $Vin_{max}$ and simulations of the circuit of the power converter, define the switch (for example, a transistor) maximum absolute voltage rating (for example, as at step 302A of FIG. 3). For example, no less than 5% greater than $Vin_{max}$:

$$Vin_{MAX}=V_{in}+V_{diode}+V_{FET}+V_{spike}$$

where $V_{diode}$ denotes the bias voltage of a serial diode (when used in the circuit), $V_{FET}$ denotes the voltage drop on the field effect transistor (FET) and $V_{spike}$ may be simulated from the driving strength, current, voltage, temperature, and/or the like.

3. When a linear function is used, calibrate the linear coefficients A and B as follows:
   a. Build a matrix of driving strength for all values of Vin and input current, for example, from minimum to maximum current (for example, as at step 303 of FIG. 3).
   b. Choose the driving strength envelopes (for example, as at step 304 of FIG. 3) for both low side and/or high side transistors, such that V_LX (the buck switching node voltage) is as high as possible but no more than maximum absolute rating minus a safety factor (for example, 2% for each transistor (for example, for the low side transistor we look at the high side gate driving strength and for the high side transistor we look at the low side gate driving strength).
   c. Fit the chosen drive strength envelop to an equation (for example, as at step 305 of FIG. 3), for example a linear equation with coefficients A and B.

Driver strength may decrease naturally when the slope of the switching node voltage is high, and a passive effect of the gate driver may be to slow the switching speed. This passive gate driver speed control is much less pronounced and effective than the active gate driver speed control disclosed herein. The active gate driver speed control may be a function of the current, such as when the current is high, the driver may lower the gate driving strength. For example, when an increasing current passes a threshold of 87% of the maximum current, the gate speed is reduced linearly to zero when the current reaches 95% of the maximum. Similarly, a temperature dependence of the gate driver may produce an effect where the driving current may be increased or decreased passively, depending the electrical response of the gate drive and gate to temperature increase.

In some applications, the driver strength may be increased due to the sensor measurements. For example, when a sensor measurement indicates that a lower voltage is present across the terminals of a switch, the gate driver may use a faster switching current, speed, and/or waveform.

Driving a gate of a power switch, in terms of driving strength such as when measured by driving power, energy, current, voltage, impedance, etc., may be evaluated by the bottom line time and waveform for changing from an on state to an off state, or from an off state to an on state. A gate drive, such as a switching node as part of a circuit, while changing the power gate state, may affect the bottom line time and shape of the gate transition. For example, parasitic capacitances may generate a feedback current that passes to the driving gate node. For example, parasitic inductances and parasitic resistances may negatively affect the gate transition. For example, a linear negative feedback of the gate current to the drive strength may cause an increase in gate current to decrease drive strength. For example, a parasitic capacitance with high current increase the switching node voltage to a higher value (such as in a linear formula I=C*dV/dt) and thereby cause a negative effect. Application of the disclosed aspects herein, may sense the operating conditions and adjust the driving strength (current, voltage, waveform, etc.) of the switch gates. For example, by sensing the current and adjusting the gate timing and strength (including ramp up rate, period, dead-time, etc.) as the current goes higher, and thereby protecting switch from voltage spikes that may have higher values due to the higher current.

In general, at high currents, $V_{FET}$ may increase to the voltage amplitude, specifically in switches that have a high ON-resistance (high $R_{ds,ON}$). Sometimes, $V_{FET}$ may be larger than the voltage across the FET parasitic diode, or when there is zero dead time and the switch is turned on before the diode conducts.

The gate driver may control the gate current, the gate voltage, the gate driver impedance, the timing of the gate driving pulse, the waveform of the gate driving pulse, and/or the like. For example, adiabatic switching pulse waveforms may be determined by the gate driver. For example, a pulse waveform may be determined as a boxcar waveform by the gate driver. For example, dead time (for example, the time between the ending of one gate pulse to the beginning of another gate pulse) between the alternate driving of two switches may be determined by the rules. For example, a dead time of 20 nano-seconds may be determined during operational modes of the power converter that would benefit from high efficiency conversion, and a dead time of 1 millisecond may be determined during a low efficiency operational mode of the power converter, for example, during warmup. The absolute or relative timings may be used for better adjusting the gate driver pulses to meet the requirements of a particular power converter and/or operating mode. The timings adjustments may be by turn-on timing, dead time, turn-off timing, and/or the like.

The gate driver may use high temporal resolution sensors for voltage, current, and/or the like, to provide on-the-fly gate driving strength adjustments. For example, an electrical component that is sensitive to a voltage threshold (for example, a thyristor or the like) may be used, and when a voltage spike approaches or exceeds a threshold, the gate strength may be reduced to prevent the voltage across the switch from exceeding the maximum rated voltage. For example, a high speed (HS) analog-to-digital voltage/current sensor may measure the voltage spikes directly, and the gate driver may receive the HS sensor value and reduce the gate strength to prevent the voltage across the switch from exceeding the maximum rated voltage.

For example, the following table is simulated data for the operation of a circuit where (Vmax_abs_rating=65 V):

TABLE 1

Example spike voltages at different Vin and drive strengths.

| Vin (V) | Ig (A) | Vspike (6 MHz sampling frequency) |
|---|---|---|
| 40 | 3 | 60 |
| 40 | 2 | 50 |
| 40 | 1 | 40 |
| 50 | 3 | 70 |
| 50 | 2 | 60 |
| 50 | 1 | 50 |
| 60 | 3 | 80 |
| 60 | 2 | 70 |
| 60 | 1 | 60 |

Operating points may be selected from TABLE 1 that do not exceed the rating.

TABLE 2

Selected operating conditions of TABLE 1 that do not exceed the Vmax_abs_rating of 65 V.

| Vin (V) | Ig (A) | Vmax (V) |
|---|---|---|
| 40 | 3 | 60 |
| 50 | 2 | 60 |
| 60 | 1 | 60 |

In this example, the driving strength may be determined by the equation: $Ig=-Vin*0.1+7$. Other examples may produce different tables, rules, and/or equations.

When a SMPS has two switches connected in series, the center node voltage (voltage at the central point between the two switches) may have high dV/dt as the voltage here may jump from Vin to 0 and back to Vin. For example, voltage spikes at the source of the low-side switch (due to operation of the low side switch) may cause voltage spikes between the source and drain of the high-side switch. Similarly, a multi-level inverter with a series of switches may see voltage spikes at intermediate switches due to the gate switching strengths of other switches in the series. Thus it may be necessary to simulate multiple operating modes to determine the voltage spikes across each switch, and a rule may adjust the gate driving strength of one switch to prevent voltage spikes on another switch.

Measuring temperature using temperature sensors may further identify operating condition that cause (or affect the magnitude of) voltage spikes. These temperature sensor values may be used in the rules. This may be particularly useful in solar power converter applications, for example, DC/DC converters or DC/AC converters (for example, inverters) connected to photovoltaic generators, and/or the like. For example, with increasing temperature, the voltage rating of the maximum allowable voltage on the switch may increase, and the voltage of the photovoltaic (PV) panel may decrease, thereby reducing the voltage spikes and increasing the voltage margin between voltage across the switch and the increased maximum allowable voltage across the switch. These operating conditions (for example, higher temperature of the PV panels, the DC/DC converters located near the panels, and/or the like) may allow the switching strength to be larger without adversely affecting the reliability of the switches.

In an example of lower temperatures, the maximum voltage rating of the switches may decrease, and the voltage of the PV panels (for example, at maximum power point operation) may increase, thus causing the voltage spikes to be larger and the voltage margin to be smaller. When these operating conditions are not taken into account, the reliability of the switches may decrease as the larger voltage spikes may exceed the lowered headroom. Such a situation may be present when the solar power generation system is starting operation in the morning, and the temperatures of both the panels and the electronics are low. As the day progresses, and the operation of the electronics becomes more strenuous (for example, when input power increases due to the lower incidence angle of the sunlight on the solar panels), the operating temperatures may increase and the voltage spikes may need less headroom so the switch gates may be driven with stronger gate driver pulses.

The voltages, currents, and temperatures during operation of solar power generation systems may also be influenced by the time of day, electricity grid rules (for example, feed-in tariffs, virtual power plant server commands, and/or the like). For example, electrical utility grids may require that solar power generation systems limit the power feed into the grid during the middle of the day when the consumption is lower, so as to avoid an imbalance between overall consumption and generation of the electrical grid. This limiting, also known as "clipping", may allow for a less efficient operation of a power converter, since the converter is unable to provide the full capacity of available power to the grid anyway. Clipping may be implemented utilizing several techniques, for example, the controller of the converter lowering the operating point voltage of the PV panels (thereby lowering the input voltage and thus lowering the voltage spikes), changing the power converter to operate using soft-switching, reducing the gate driving strengths, and/or the like. These techniques (e.g., operating using soft switching, reducing the gate driving strength, and/or the like) are beneficial by increasing the reliability of the switches (e.g., MTBF) during periods of time when clipping is specified by the electrical grid.

Benefits of the disclosed gate drivers (e.g., over previous drivers) may include reduced or absent protection components in the circuit (e.g., protection devices that prevent voltage spikes), the reduction in the maximum voltage rating of the switches (e.g., allowing switches to benefit from small sizes, low costs, increased switch reliability, and/or the like), eliminating the need for real-time voltage and current measurements in gate driver logic (e.g., using a sampling greater than a fraction the clock rate of the SMPS), reduced sensor noise (e.g., longer sensing times), low-speed sensors for measuring steady state operating parameters (e.g., insensitive to transient parameters, jitter, etc.), and/or the like. The gate driving strength may be responsive to sensor measurements that do not require high-speed measurements and fast logic processing, and allows the switch to work at highest efficiency during normal operation. During irregular operation (e.g., when voltage spikes are more likely to occur, for example device startup, device shutdown, changing of device modes, self-testing, and/or the like) the efficiency may be reduced due to the reduced driving strength, but the reliability (e.g., lifetime, MTBF) of the entire device may be increased.

Another example may be when the inverter (for example, inverter 410 above, with reference to FIG. 4) is rated at a maximum power rating that is lower than the total maximum power of all PV panels in the system. In this example, the controllers of DC/DC power converters attached to panels (e.g., in 401A) may perform clipping (e.g., by lowering the input voltage to the inverter) to protect the inverter 410 from receiving power over the inverter rating. Alternatively, the inverter may operate by limiting the input current and operate less efficiently with lower strength gate driving pulses. In these cases, the reduced efficiency may be traded towards gaining improved reliability by implementing weaker gate-driving techniques. The improved reliability for this and similar clipping techniques allow operating with increased switch reliability (e.g. weaker gate driving).

During hard switching of a power converter, large voltage spikes may occur at low current (for example, when the current is Ids-delta(Ids)), and during soft switching (e.g., resonant topologies, quasi-resonant topologies, forced resonant topologies, and/or the like) the large voltage spikes may occur at high current (for example, when the current is Ids+delta(Ids)). For example, this may be beneficial when the power converter is designed to operate using both hard switching and soft switching, and the switching method (for example, an operational mode) may be selected based on the available power from the panels, the power rating of the inverter, the power clipping directives from the electrical grid, and/or the like. The gate drivers may then use the operational mode and other information to determine whether to use hard switching, soft switching, high driver strength, medium driver strength, low driver strength and/or the like.

Drive strength and waveform may be determined by operating a certain number of switches used within the gate driver and/or selecting the types of switches in the gate driver output stage. This may allow gate driver waveform shaping as well as driver strength selection. One or more electrical amplifiers (for example, an operational amplifier—OpAmp, a transimpedance amplifier, a transconductance amplifier, and/or the like) may be used to implement partial strength driving (e.g. programmable, controlled, predetermined, and/or the like). For example, an equation may be hardwired in the gate driver logic using amplifiers, and the resulting signal input to cascading-levels of switches (e.g., transistors, FETs, insulated-gate bipolar transistors, and/or the like) configured such that a larger number of switches of the gate driver may be activated to support a stronger gate switching, and fewer switches when a reduced strength driving is specified by the sensor measurements. For example, a LUT may be implemented in a gate driver using an OpAmp and respective cascade of gate driving switches, as in the following exemplary illustrations.

Figure 5A:
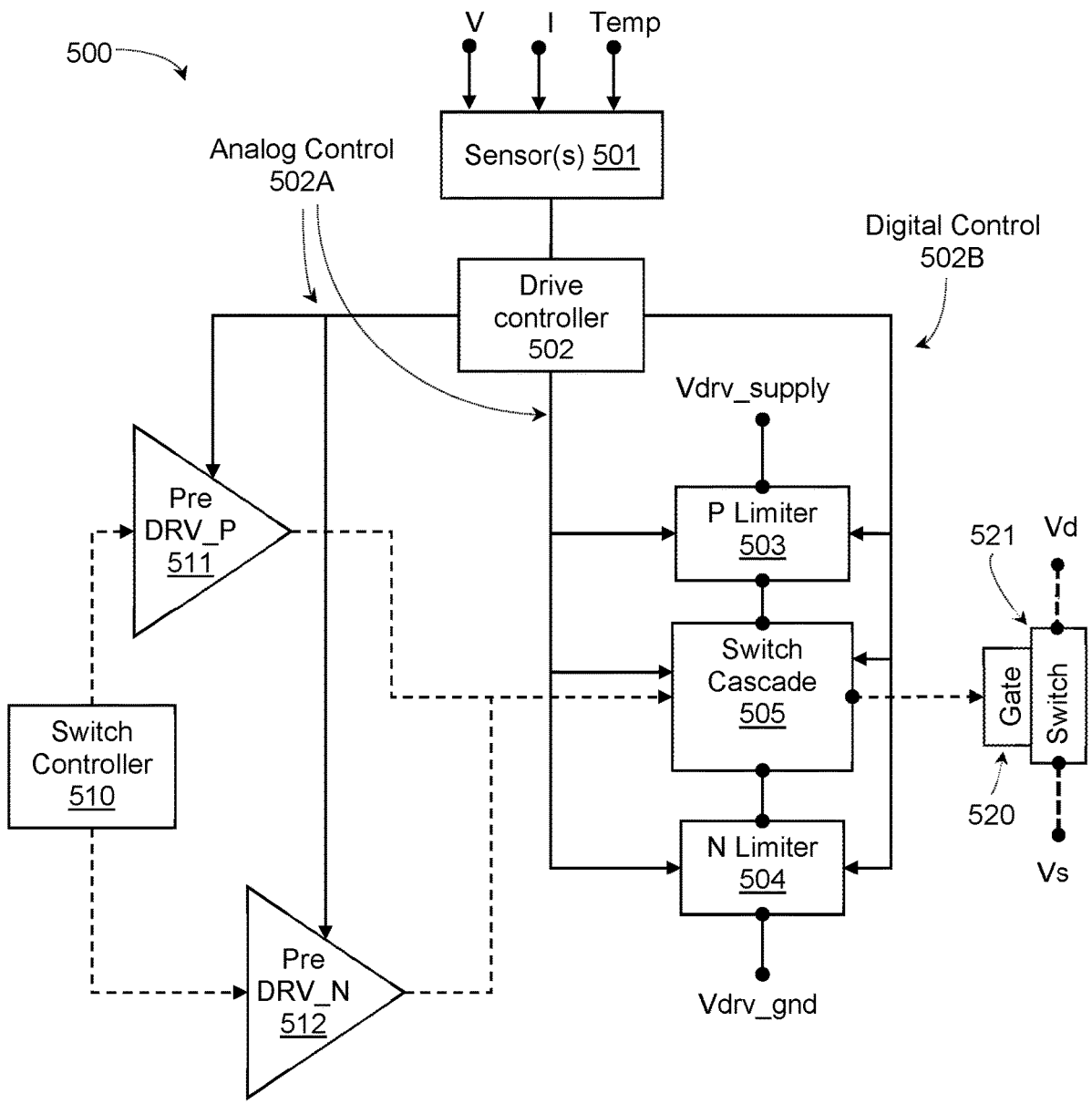
FIGS. 5A, 5B and 5C show, schematically, examples of reliable gate driver circuits, according to illustrative aspects of the disclosure.
Figure 5B:
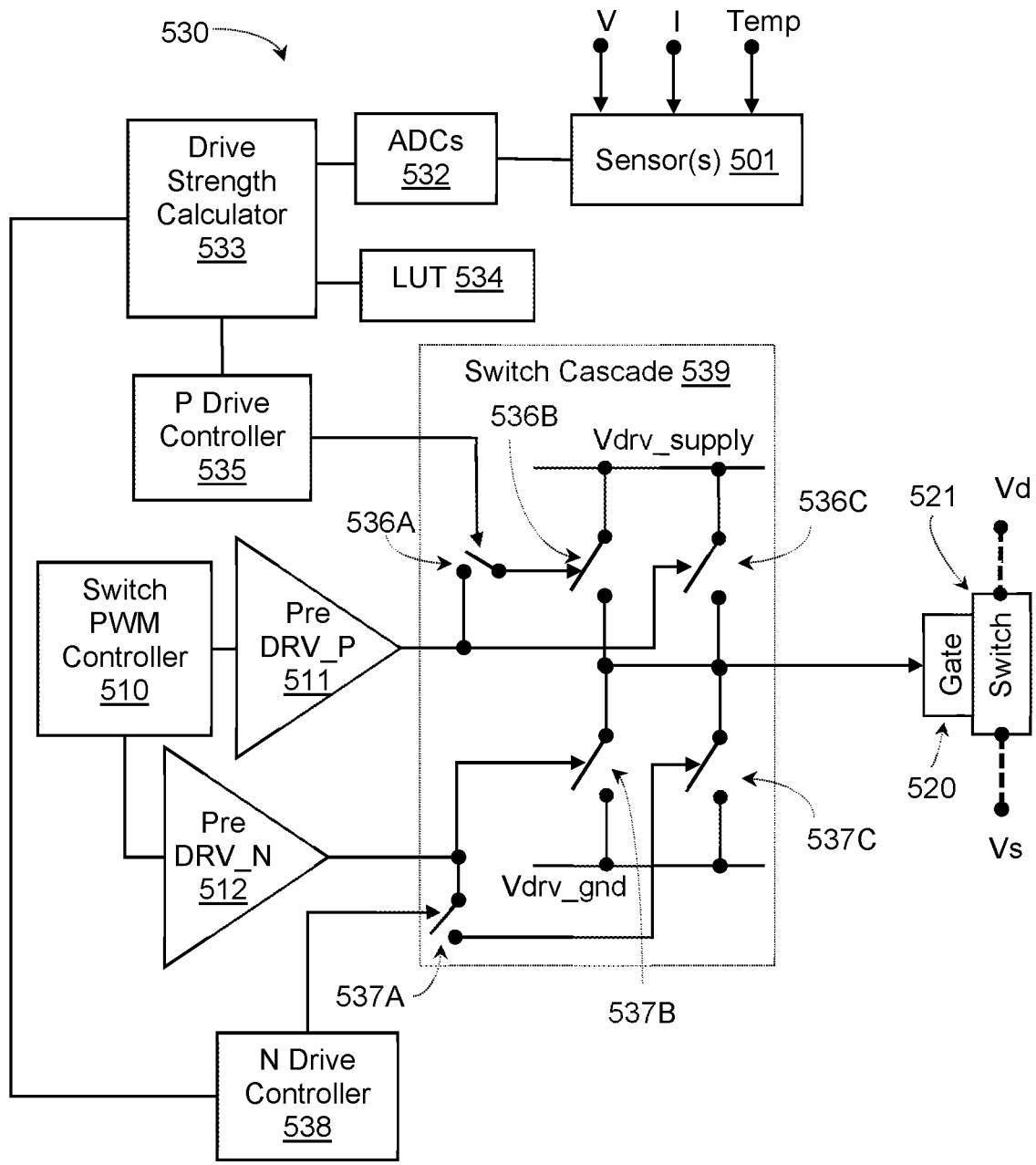

Reference is now made to FIGS. 5A and 5B, which show examples of gate driver circuits 500 and 530.

Measurement resolution of sensor measurements may be a challenge for detecting the voltage spikes. The spikes may last a few milliseconds or less, and a low-cost sensor may need a long time to get an accurate sensor measurement. For example, a voltage spike may last one nano-second, one micro-second, one millisecond, or the like, and the peak voltage (maximum voltage) may not be measureable, yet still cause damage to the power converter switches. Thus aspects disclosed herein may allow measuring baseline (for example, DC, instantaneous DC, averaged DC, integrated measurements, and/or the like) values of voltages, currents, temperatures, and/or the like with slow measuring rate sensors, and using the gate driver rules, determining a gate strength based on the baseline sensor measurements, and optionally, based on the simulations and prototype measurements, without using high-speed sensors to detect the peak instantaneous voltage spikes.

Reference is now specifically made to FIG. 5A, which shows, schematically, an example gate driver circuit 500 that may be used, for example, to implement gate drivers as at 103, 113, 123, 440, and 441, according to illustrative aspects of the disclosure. One or more sensors 501 are configured to measure a circuit operational parameter, for example, a voltage (for example V), a current (for example I), a temperature (for example Temp), of a conductor, terminal, or component of a circuit of a power converter. Sensors 501 may include one or more sensing elements, one or more detecting elements, amplifiers, analog-to-digital converters, and/or the like, depending on the techniques used to compute the gate strength. Sensors 501 types may include voltage sensors, current sensors, temperature sensors, and/or the like. Sensor(s) 501 may be connected to a drive control 502 comprising analog control circuits, digital control circuits, analog-to-digital converters (ADCs), and/or the like. Analog control signals 502A may be generated by drive control 502 responsive to sensor signals (for example, a signal used to produce a series of sensor measurement digital values), and conducted to pre-drive amplifiers (for example, pre DRV_P 511, pre DRV_N 512, and/or the like), high-side current limiter (P Limiter 503), low-side current limiter (N Limiter 504), a switching cascade 505, and/or the like. Drive control 502 may generate digital control signals 502B responsive to sensor(s) 501 signals/values. Digital control signals 502B may be conducted to high-side current limiter (P Limiter 503), low-side current limiter (N Limiter 504), a switching cascade 505, and/or the like. P Limiter 503 may limit the source current and N Limiter 504 may limit the sink current, thereby allowing control of the turn-on and/or turn-off currents respectively. Drive control 502 may be incorporated into switch control 510.

When the power converter is in operation, for example, the power converters 430 and 431 of FIG. 4, the Switch Controller 510 may send a signal to pre-driver amplifiers 511 and 512, which in turn may send an amplified signal to the switching cascade 505. Switching cascade 505 may send a gate driving signal to gate 520 of switch 521, which in turn will conduct current between its switch terminals (e.g., Vd and Vs). Drive strength may be determined by analog control signal 502A and/or digital control signal 502B through the gate driving circuit of Vdrv_supply, current limiter P Limiter 503 and/or N Limiter 504, Switching Cascade 505, pre DRV_P 511, pre DRV_N 512, and/or the like.

Reference is now made to FIG. 5B, which shows, schematically, an example gate driver circuit 530 that may be used, for example, to implement gate drivers as at 103, 113, 123, 440, and 441, according to illustrative aspects of the disclosure. Example gate driver circuit 530 illustrates how digital control signals that represent sensor(s) 501 values may be used to determine gate driving strengths. As in FIG. 5A, one or more sensors 501 are configured to provide one or more measured operational parameters. In this example, the sensors values may be converted to digital values when needed using ADCs 532. Alternatively, a Drive Strength Calculator 533 may receive analog values from the sensors. The sensor values (or analog voltage levels) may be sent to Drive Strength Calculator 533, which may calculate the drive strength to use based on the sensor values (and optionally based on simulation and prototype data). The Drive Strength Calculator 533 may comprise (or be implemented by), for example, for example, a controller circuit, central processing unit (CPU) (for example, executing software), hardware processor(s), and/or the like for performing the calculation of drive strength (for example, according to processes 200 or 300). When needed for the calculations, LUT 534 values may be retrieved, for example, from a hardware digital data storage, a digital information repository, a memory, and/or the like. Drive Strength Calculator 533 may, based on the calculated drive strength, send the control signals, for example, digital signals, to drive control, for example, a P Drive control 535, an N Drive Control 538, and/or the like. Drive controls 535 and 538 send control signals to switches of a switch cascade 539, for example, switches 536A and 537A, which in turn may determine the operation of one or more gate current control switches 536C and 537C. Although switches 536B, 536C, 537B, and 537C are represented as ideal switches, in practice switches comprise a resistance when closed, and thus operating more switches in parallel result in a lower resistance and following this a higher drive current.

In some applications a two-stage gate driver may be used, such as a gate driver with a first stage that has fast switching and high current for efficient switching, and a second stage that connects a low resistance driving stage for improved efficiency. For example, a first gate driver has a high efficiency switching strength and timing (such as gate current, voltage, power, waveform, timing, etc.) for a given logic signal at optimal switching conditions. For example, a second gate driver maintains consistent logical gate operation during transitions where the switching node voltage may rise or fall at rates of gigavolts per second.

Aspects disclosed herein may compensate for higher driving resistivity/voltage/current by controlling the gate driver's resistivity at a certain gate driving strength, and holding the gate driving state when the gate driver switches to a second resistivity, or transition between resistivities. For example, a configurable (such as analog and/or digital controlled) output gate driving stage may comprise multiple serial/parallel gate drivers that are controlled separately (possibly simultaneously) to fine tune the gate driving strength in response to a change in gate and/or switch resistance. For example, a gate control may be assisted by analog devices, such as higher gate to source voltage may lower the resistivity of the gate switch driver. For example, a current source gate driver control may be implemented to control the current to the gate in response to a measured circuit current/voltage/resistance etc.

In this example, when the power converter (for example, one of the power converters 430 and 431 of FIG. 4) is in operation, the Switch Controller 510 may send a signal to pre-driver amplifiers 511 and 512, which in turn may send an amplified signal to the gates of switching cascade 539. Switching cascade 539, in response to receiving the amplified signal, may send a gate driving signal to gate 520 of switch 521, which in response, will conduct current between the switch terminals (e.g., Vd and Vs). Drive strength may be determined by analog control signals (not shown—as at 502A of FIG. 5A) and/or digital control signal (not shown—as at 502B of FIG. 5A) for gate driving of switches 536A and 537A. For example, when 536A is closed then OpAmp 511 may operate both switches 536B and 536C, thereby increasing the turn-on drive strength to gate 520. For example, when 537A is closed then OpAmp 512 may operate both switches 537B and 537C, thereby increasing the turn-off drive strength to gate 520.

In the example of FIG. 5B the inclusion or exclusion of switches in switching cascade 539 may be determined based on the values (digital or analog) from sensors 501. Adding more switches may add strength (for example, current) to the operation of gate 520. Similarly, additional levels of switches may be incorporated into switching cascade 539 such that many levels of strength can be determined by Drive Strength Calculator 533, for example, based information from sensor(s) 501. For example, switching cascade 539 may comprise 2 levels, 3 levels, 4 levels, 5 levels, 6 levels, 7 levels, 8 levels, 9 levels, 10 to 20 levels, 20 to 50 levels, 50 to 100 levels, 100, to 500 levels, 500 to 5000 levels, and/or the like. The more levels that are added the more steps of gate driving strength will be controllable by 533. Similarly, the switches of each level may be of different types and strengths, thereby allowing to change the shape of the gate driving strength waveform. Timing controls may be added to the gate driver controller 510 or strength calculator 533 to change the profile of the gate driving strength waveform. For example, a digital delay may be used by the gate controller to modify the gate driving strength and/or waveform during each cycle. For example, an analog delay circuit may be used to modify the gate driving strength and/or waveform during each cycle. Other combinations of electrical components may be used to implement digital control of gate driving strength, such as equivalent combinations of switches that decrease or increase resistance of the current flowing to gate 520 or from gate 520. For example, added levels of switches, equivalent to 537C may be implemented to allow increased number (for example, resolution of gate driving strengths) of gate driving strength levels for driving gate 520.

Figure 5C:
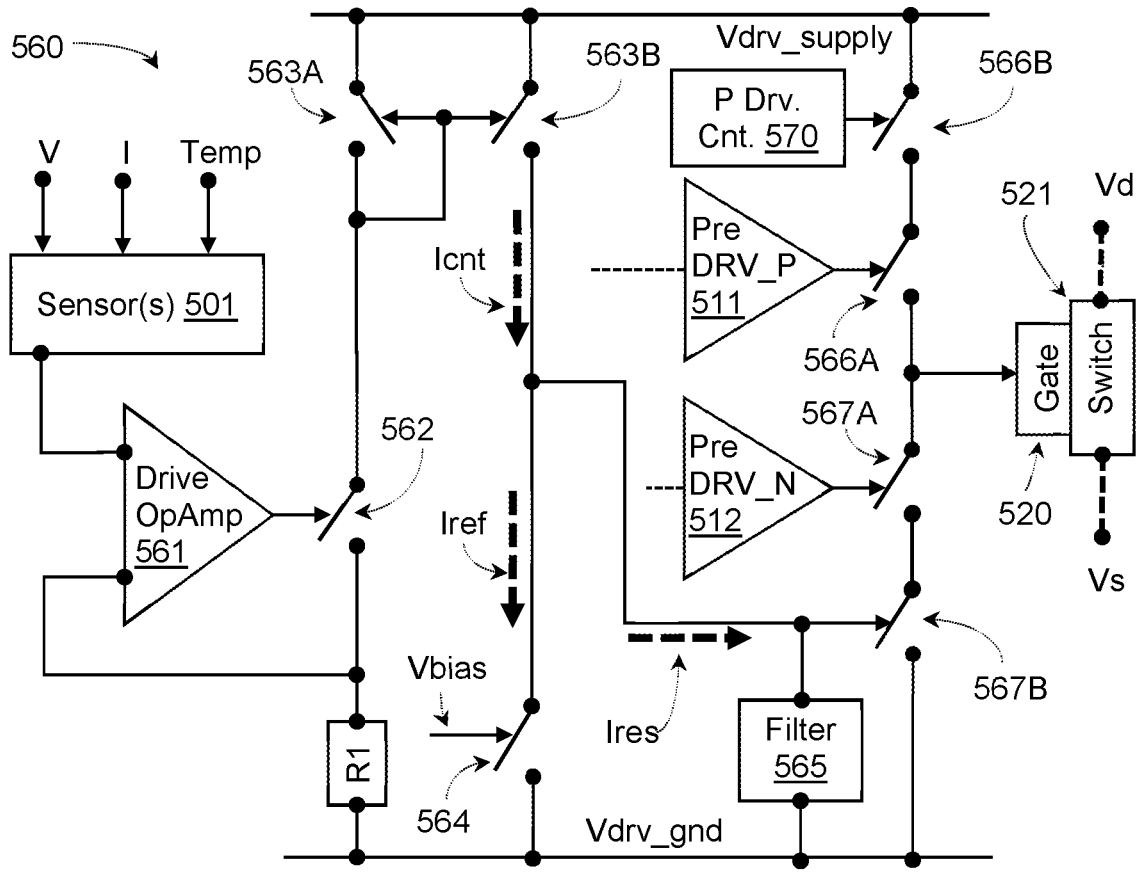

Reference is now made to FIG. 5C, which shows, schematically, an example gate driver circuit 560 that may be used, for example, to implement gate drivers as at 103, 113, 123, 440, and 441, according to illustrative aspects of the disclosure. Example gate driver circuit 560 illustrates how analog control signals representing sensor(s) 501 values may be used to determine gate driving strengths. As in FIG. 5A, one or more sensors 501 are configured to measure to a circuit operational parameter(s). In this example, the sensors analog signals may be connected to a Drive OpAmp 561 which operates switch 562. Resistor R1 and OpAmp 561 determines the current flowing through 562 and 563A, which is mirrored in 563B, thereby adjusting current Icnt to equal Vdrv_supply divided by the resistance value of R1. A bias voltage Vbias applied to the gate of switch 564 determines a current Iref, which reduces Icnt to Ires (Ires=Icnt−Iref). Ires is the current applied to the gate of switch 567B and it determines the current limit through the switch 566A and 566B (for example, the end stage of switching cascade 505 of FIG. 5A). A filter 565 may be connected to Vdrv_gnd to remove spikes and noise from Ires. A similar circuit, for example, a voltage controlled current source circuit or the like, (P Dr. Cnt. 570) may be applied to switch 566B to determine the turn-on strength. In this example Iref is positive and with changes to the circuit Iref may be negative. Alternative configurations may be used, such as where Drive OpAmp 561 is a transconductance amplifier or current amplifier (depending on the sensor signal) that may receive analog sensor signals and outputs current Ires. For example, other configurations of electrical components may be used that perform equivalently to circuit describe in that they modify the gate driver strength (for example, gate drive current, waveform, ramp-up, ramp-down, and/or the like) based on sensor measurements, for example, based on steady state voltage, current or temperature measurements.

Gate driver circuits 500, 530, and 560 may be implemented together for the same gate driver as at 103, 113, 123, 440, and 441. For example, gate driver circuit 500 may use the digital control of gate driver circuit 530 for implementing 502B. For example, gate driver circuit 500 may use the analog control of gate driver circuit 560 for implementing 502A. Other examples may use combinations of gate driver circuits 530 and 560 together, such as incorporated into gate drive circuit 500 or independent of gate driver circuit 500. Analog control circuits for gate drivers may use different types of amplifiers, such as operational amplifiers, transinductance amplifiers, transconductance amplifiers, and/or the like.

In this example, as in the examples of FIGS. 5A and 5B, when the power converter is in operation, for example, the power converters 430 and 431 of FIG. 4, a switch controller (not shown) may send a signal to pre-driver amplifiers 511 and 512. Pre-driver amplifiers 511 and 512 may be connected to gates 566A and 567A. Operation of gates 566A and 567A may determine a gate driving signal to gate 520 of switch 521, and conduction of current between Vd and Vs. Drive strength may be determined by the current limiters 566B and 567B operated according to the sensor voltages.

As used herein the terms controller and controller circuit mean an electronic component configured to implement one or more functions, such as a method, a rule, and/or the like, to operate and control one or more other electronic circuits. For example, a controller may be a central processing unit, a micro-processor, an embedded controller, a digital hardwired logic circuit, an application specific instruction set processor, an application specific integrated circuit, a multi-core processor, a field programmable gate array (FPGA), or the like. The controller (or controller circuit) may interpret and execute instructions that, for example, may be stored in memory (such as hardware-based digital storage) accessible by the controller, stored as software in a repository, hardwired in digital logic or an FPGA, and/or the like. For example, an apparatus may comprise a controller (e.g., a processor) and memory storing instructions, that when executed by the controller, cause the apparatus to implement one or more functions, such as those described in FIGS. 2 and 3 and any other function described herein e.g., with respect to an apparatus 100, 110, 120, 400, 401A, 410, 500, 530, 560). For example, the controller (such as a controller circuit) may be configured (using specific hardware and software) to adjust a strength of the driver pulse to multiple values in a range between an upper pulse strength limit and a lower pulse strength limit, depending on the sensor values, the voltage and/or current between the source and drain of the switch of the power converter, and/or the like. For example, the pulse strength will be at the upper limit when the voltage and/or current between the source and drain of the switch is below a threshold. For example, the pulse strength will be at the lower limit when the voltage and/or current between the source and drain of the switch is substantially near the maximum switch ratings.

The aspects disclosed herein may be applied as discrete electrical components, systems on a chip, systems in package, integrated circuits, mixed signal application specific integrated circuits, and/or the like. For example, a utility scale application (for example, a power converter designed for mega-watt scale power conversions) may implement the aspects disclosed herein with discrete high power components, for example, to implement 101, 111, 101, 111, 112, 121, 122, 127, 128, 430, 431, or 521. For example, a power device (for example, 410 of FIG. 4) application up to a few hundreds of watts (or even a few thousand watts) may implement the aspects and components (for example: 101, 111, 101, 111, 112, 121, 122, 127, 128, 430, 431, 521) disclosed herein as mixed signal ASICs. Different power levels of the power converters may require both components and IC level components as solutions for switches (for example, 101, 111, 101, 111, 112, 121, 122, 127, 128, 430, 431, 521).

Example devices (e.g., power converters) that may benefit from the use of gate drivers disclosed herein (e.g., gate drivers that read sensors, as at 104, 114, 124, and 501, and use rules, as at 202, 203, and 305, to determine gate strength) follow in a non-exclusive list. For example, aspects disclosed herein may be used for driving one or more switches (e.g., 101, 111, 112, 121, 122, 127, 128, 430, 431, 521) of: an AC-AC converter, an AC-AC frequency conversion inverter, an AC-DC converter, an active clamp forward converter, an asymmetric half bridge converter, a Barthold converter, a Bassett converter, a boost converter, a boundary-mode converter, a boundary-conduction-mode converter, a bridgeless converter, a bridgeless PFC converter, a bridgeless power factor correction converter, a buck-boost converter, a buck converter, a cascade flyback converter, a Clarke converter, a continuous-mode converter, a continuous-conduction-mode converter, a converter, a convertor, a coupled inductor Ćuk converter, current doubler, a current-fed push-pull converter, a current-mode control converter, a Ćuk converter, a DC-DC converter, a diagonal half-bridge flyback converter, a direct off-line converter, a discontinuous-mode converter, a double-ended forward converter, a dual-switch flyback converter, a dual-switch forward converter, a feed-forward converter, a fixed frequency converter, a fly-buck converter, a flyback converter, a flyback current-fed push-pull converter, a forward converter, a four-switch buck-boost converter, a frequency converter, a frequency inverter, a full-bridge converter, a full-bridge push-pull converter, a half-bridge converter, a half-bridge push-pull converter, a half-bridge resonant converter, an integrated magnetics Ćuk converter, an interleaved synchronous buck converter, an inverse Watkins-Johnson converter, an inverter, an inverting buck-boost converter, an isolated buck converter, isolated converter, a LCC (inductor-inductor-capacitor) resonant converter, a LLC resonant converter, a LLC resonant half-bridge converter, a modified sine wave inverter, a multi-phase converter, a multiple-input converter, a multiple-output converter, a non-inverting buck-boost converter, a non-isolated converter, a non-saturating push-pull self-oscillating converter, an off-line converter, a parallel resonant converter, a parallel resonant converter (PRC), a passive power factor correction (PFC) converter, a PFC converter, a power factor correction converter, a power factor pre-regulator, a pulse-width modulation converter, a push-pull converter, a pulse width modulation (PWM) converter, a quadratic boost converter, a quasi-resonant converter, a quasi-resonant flyback converter, a RCC converter, a resonant converter, a resonant single-ended primary-inductor converter (SEPIC) converter, a ringing choke converter, a Royer circuit, a Royer oscillator, a saturating transformer converter, a self-oscillating flyback converter, a series-parallel resonant converter, a series resonant converter, a Sheppard-Taylor converter, a sine-wave inverter, a single-ended forward converter, a single-ended primary-inductor converter, a single-stage PFC converter, a single-stage power factor correction converter, a single-transistor forward converter, a series-parallel resonant converter (SPRC), a squegging converter, a Series resonant converter (SRC), a switched converter, a synchronous buck converter, a tapped-inductor converter, a transition-mode converter, a two-switch back-boost converter, a two-switch flyback converter, a two-switch forward converter, a two-switch isolated boost converter, a two-transformer self-oscillating converter, a two-transistor forward converter, a valley-fill current shaper, a variable frequency converter, a voltage-mode control converter, a Watkins-Johnson converter, a Weinberg converter, a zeta converter, a zero voltage switching (ZVS) buck converter, a ZVS buck-boost converter, a ZVS converter, and/or the like. Note that not all switches of a converter may require reliable gate drivers, and the aspects disclosed herein may be applied to one or more gate drivers of one or more gates of one or more switches. The power converter may be a single phase converter, a multi-phase converter, a three-phase converter, and/or the like. The power converter may be a main power converter, an auxiliary power converter, a backup power converter, and/or the like.

Example devices that use the disclosed gate drivers, as at 103, 113, 123, 440, 500, 530, and 560, may include multiple stages of switches, each stage possibly having different quantities, sizes and types of switches as at 101, 111, 101, 111, 112, 121, 122, 127, 128, 430, 431, 521. For example, gate driver switches and/or power converter switches may be transistors, a bipolar junction transistor, a field-effect transistor (FET), a junction FET, an insulated gate FET, a metal-oxide-semiconductor FET, a metal-semiconductor FET, a high-electron-mobility transistor, a depletion-mode FET, an enhancement-mode FET, an n-channel FET, a p-channel FET, an insulated-gate bipolar transistor, a heterojunction bipolar transistor, a Schottky transistor, an avalanche transistor, a Darlington transistor, a multiple-emitter transistor, a carbon nanotube field-effect transistor, an inverted-T field-effect transistor, a fin field-effect transistor, a fast-reverse epitaxial diode field-effect transistor, an organic field-effect transistor, a floating-gate transistor, a tunnel field-effect transistor, a diffusion transistor, a unijunction transistor, a single-electron transistors, an insulated-gate bipolar transistor, a tetrode transistor, a pentode transistor, a trigate transistor, a dual-gate FET, a junctionless nanowire transistor, an organic electrochemical transistor, and/or the like combinations of the above.

Here, as elsewhere in the specification and claims, ranges can be combined to form larger ranges.

Specific dimensions, specific materials, specific ranges, specific resistivities, specific voltages, specific shapes, and/or other specific properties and values disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (for example, the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

In the description of various illustrative features, reference is made to the accompanying drawings, which form a part hereof, and in which is shown, by way of illustration, various features in which aspects of the disclosure may be practiced. It is to be understood that other features may be utilized and structural and functional modifications may be made, without departing from the scope of the present disclosure.

It may be noted that various connections are set forth between elements herein. These connections are described in general and, unless specified otherwise, may be direct or indirect; this specification is not intended to be limiting in this respect, and both direct and indirect connections are envisioned. Further, elements of one feature in any of the embodiments may be combined with elements from other features in any of the embodiments, in any combinations or sub-combinations. For example, a cascade of switches may be used to implement multiple levels of driving strength, some levels comprising digital control as at 530 and other levels comprising analog controls as at 560.

All described features, and modifications of the described features, are usable in all aspects taught herein. Furthermore, all of the features, and all of the modifications of the features, of all of the embodiments described herein, are combinable and interchangeable with one another.

What is claimed is:

1. An apparatus, comprising:
   a switch, wherein the switch comprises a source and a drain, or a collector and an emitter, and wherein the switch comprises a control terminal;
   a sensor configured to measure a voltage magnitude between the source and the drain, or between the collector and the emitter; and
   a controller circuit configured to:
   receive the voltage magnitude from the sensor;
   determine a current magnitude based on the voltage magnitude; and
   a driving pulse comprising the current magnitude to the control terminal.

2. The apparatus of claim 1, further comprising one or more additional sensors, wherein the controller circuit is configured to:

receive one or more sensor signals from the one or more additional sensors;

determine one or more driving pulse parameters based on the voltage magnitude and the one or more sensor signals, wherein the one or more driving pulse parameters comprise a power, a voltage, a ramp-up timing, a ramp-down timing, or a waveform, and wherein the driving pulse further comprises the one or more driving pulse parameters.

3. The apparatus claim 1, further comprising a memory having a look up table stored therein, wherein the controller circuit is configured to adjust the driving pulse based on the look up table.

4. The apparatus of claim 1, wherein the controller circuit is configured to adjust the driving pulse;
to an upper pulse strength limit based on the voltage magnitude being below a first threshold, and
to a lower pulse strength limit based on the voltage magnitude being above a second threshold.

5. The apparatus of claim 1, wherein the controller circuit is configured to:
receive information indicating a mode of operation of the apparatus; and
adjust, based on the information, the driving pulse.

6. The apparatus of claim 5, wherein the mode of operation comprises a soft switching mode, a hard switching mode, a startup mode, a clipping mode, or a selected voltage range mode.

7. The apparatus of claim 1, wherein the controller circuit is configured to adjust the driving pulse between an upper pulse strength limit and a lower pulse strength limit as a linear function of the voltage magnitude.

8. The apparatus of claim 1, further comprising a temperature sensor, a voltage sensor, a current sensor, or an operational mode sensor.

9. The apparatus of claim 1, wherein the switch comprises a transistor, and wherein the control terminal comprises a base or a gate of the transistor.

10. A method comprising:
measuring, with a controller circuit using a sensor, a voltage magnitude across a source and a drain, or across a collector and an emitter, of a switch of a power device;
determining, with the controller circuit and based on the measured voltage magnitude, a current magnitude; and
applying, with the controller circuit, a driving pulse comprising the current magnitude to control terminal of the switch.

11. The method of claim 10, further comprising:
receiving one or more sensor signals from one or more additional sensors; and
determining one or more driving pulse parameters according to the voltage magnitude or the one or more sensor signals, wherein the one or more driving pulse parameters comprise a power, a voltage, a ramp-up timing, a ramp-down timing, or a waveform, and wherein the driving pulse further comprises the one or more driving pulse parameters.

12. The method of claim 10, further comprising adjusting the driving pulse to:
an upper pulse strength limit based on the voltage magnitude being below a first threshold, and
a lower pulse strength limit based on the voltage magnitude being above a second threshold.

13. The method of claim 10, further comprising:
receiving information indicating a mode of operation of the power device, wherein the mode of operation comprises a soft switching mode, a hard switching mode, a startup mode, a clipping mode, or a selected voltage range mode; and
adjusting, based on the information, the driving pulse.

14. The method of claim 10, further comprising:
converting power with the power device, and
measuring, with one or more additional sensors, a temperature, a current, or an operational mode.

15. An apparatus comprising:
a power converter comprising one or more switches;
one or more sensors configured to measure a voltage magnitude between a source and a drain, or between a collector and an emitter, of one of the one or more switches; and,
a controller circuit configured to:
determine a current magnitude based on the voltage magnitude measured by the one or more sensors, and
cause a driving pulse having the current magnitude to be applied to a control terminal of the one of the one or more switches.

16. The apparatus of claim 15, further comprising an analog circuit configured to output the driving pulse to the control terminal.

17. The apparatus of claim 15, wherein the controller circuit is configured to adjust the driving pulse between an upper pulse strength limit and a lower pulse strength limit as a linear function of the voltage magnitude.

18. The apparatus of claim 15, wherein the power converter comprises a switched mode power supply, a direct-current-to-alternating-current power converter, or a direct-current-to-direct-current power converter.

19. The apparatus of claim 15, wherein the controller circuit is further configured to:
determine one or more driving pulse parameters based on one or more sensor signals received from the one or more sensors, wherein the one or more driving pulse parameters comprise a power, a voltage a ramp-up timing, a ramp-down timing, or a waveform, and wherein the driving pulse further comprises the one or more driving pulse parameters.

20. The apparatus of claim 15, wherein the one or more sensors comprises a voltage sensor and comprises a temperature sensor, a current sensor, or an operational mode sensor.

* * * * *